(12) United States Patent
Dennison et al.

(10) Patent No.: US 9,754,952 B2
(45) Date of Patent: Sep. 5, 2017

(54) FLOATING GATE MEMORY CELLS IN VERTICAL MEMORY

(71) Applicant: Micron Technology, Inc., Boise, ID (US)

(72) Inventors: Charles H. Dennison, Meridian, ID (US); Akira Goda, Boise, ID (US); John Hopkins, Meridian, ID (US); Fatma Arzum Simsek-Ege, Boise, ID (US); Krishna K. Parat, Palo Alto, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/925,589

(22) Filed: Oct. 28, 2015

(65) Prior Publication Data

US 2016/0049417 A1 Feb. 18, 2016

Related U.S. Application Data

(62) Division of application No. 13/838,297, filed on Mar. 15, 2013, now Pat. No. 9,184,175.

(51) Int. Cl.
| | | |
|---|---|---|
| *H01L 27/11556* | (2017.01) | |
| *H01L 29/66* | (2006.01) | |
| *H01L 27/11578* | (2017.01) | |
| *H01L 21/28* | (2006.01) | |

(52) U.S. Cl.
CPC .. *H01L 27/11556* (2013.01); *H01L 21/28273* (2013.01); *H01L 27/11578* (2013.01); *H01L 29/66666* (2013.01); *H01L 29/66825* (2013.01); *H01L 29/66833* (2013.01)

(58) Field of Classification Search
CPC ......... H01L 27/11556; H01L 27/28273; H01L 27/11578
USPC ............... 257/314, 315, 319, 321, 324, 329; 438/201, 258, 261, 287, 588, 666
See application file for complete search history.

(56) References Cited

U.S. PATENT DOCUMENTS

| | | |
|---|---|---|
| 6,159,797 A | 12/2000 | Lee |
| 6,445,029 B1 | 9/2002 | Lam et al. |
| 6,583,009 B1 | 6/2003 | Hui et al. |

(Continued)

FOREIGN PATENT DOCUMENTS

| | | |
|---|---|---|
| CN | 1401140 A | 3/2003 |
| CN | 1791974 A | 6/2006 |

(Continued)

OTHER PUBLICATIONS

"International Application Serial No. PCT/US2014/012798, International Search Report mailed May 19, 2014", 3 pgs.

(Continued)

*Primary Examiner* — Errol Fernandes
(74) *Attorney, Agent, or Firm* — Schwegman Lundberg & Woessner, P.A.

(57) ABSTRACT

Floating gate memory cells in vertical memory. A control gate is formed between a first tier of dielectric material and a second tier of dielectric material. A floating gate is formed between the first tier of dielectric material and the second tier of dielectric material, wherein the floating gate includes a protrusion extending towards the control gate. A charge blocking structure is formed between the floating gate and the control gate, wherein at least a portion of the charge blocking structure wraps around the protrusion.

19 Claims, 14 Drawing Sheets

(56) References Cited

U.S. PATENT DOCUMENTS

| | | |
|---|---|---|
| 7,369,436 B2 | 5/2008 | Forbes |
| 7,682,902 B2 | 3/2010 | Hsiao et al. |
| 7,910,446 B2 | 3/2011 | Ma et al. |
| 8,124,478 B2 | 2/2012 | Park et al. |
| 8,187,936 B2 | 5/2012 | Alsmeier et al. |
| 8,258,034 B2 | 9/2012 | Ramaswamy et al. |
| 8,680,605 B2 | 3/2014 | Jeon et al. |
| 8,946,807 B2 | 2/2015 | Hopkins et al. |
| 9,184,175 B2 | 11/2015 | Dennison et al. |
| 9,230,986 B2 | 1/2016 | Hopkins et al. |
| 2005/0006697 A1 | 1/2005 | Hsieh |
| 2005/0133851 A1 | 6/2005 | Forbes |
| 2006/0237768 A1 | 10/2006 | Forbes et al. |
| 2007/0047304 A1 | 3/2007 | Lee et al. |
| 2008/0012061 A1 | 1/2008 | Ichige et al. |
| 2008/0253183 A1 | 10/2008 | Mizukami et al. |
| 2008/0277720 A1 | 11/2008 | Youn et al. |
| 2009/0026460 A1 | 1/2009 | Ou et al. |
| 2009/0121271 A1 | 5/2009 | Son et al. |
| 2009/0283813 A1 | 11/2009 | Ishii et al. |
| 2010/0003795 A1 | 1/2010 | Park et al. |
| 2010/0163968 A1 | 7/2010 | Kim et al. |
| 2010/0181612 A1 | 7/2010 | Kito et al. |
| 2010/0187592 A1 | 7/2010 | Chen et al. |
| 2010/0200908 A1 | 8/2010 | Lee et al. |
| 2010/0240205 A1 | 9/2010 | Son et al. |
| 2011/0220987 A1 | 9/2011 | Tanaka et al. |
| 2011/0248334 A1 | 10/2011 | Sandhu et al. |
| 2011/0294290 A1 | 12/2011 | Nakanishi |
| 2012/0001247 A1 | 1/2012 | Alsmeier |
| 2012/0001249 A1 | 1/2012 | Alsmeier et al. |
| 2012/0058629 A1 | 3/2012 | You et al. |
| 2012/0132981 A1 | 5/2012 | Imamura et al. |
| 2012/0217564 A1 | 8/2012 | Tang et al. |
| 2012/0326221 A1 | 12/2012 | Sinha |
| 2013/0171788 A1 | 7/2013 | Yang et al. |
| 2014/0131784 A1 | 5/2014 | Davis et al. |
| 2014/0203344 A1 | 7/2014 | Hopkins et al. |
| 2014/0264532 A1 | 9/2014 | Dennison et al. |
| 2015/0140797 A1 | 5/2015 | Hopkins et al. |
| 2016/0133752 A1 | 5/2016 | Hopkins et al. |

FOREIGN PATENT DOCUMENTS

| | | |
|---|---|---|
| CN | 101118910 A | 2/2008 |
| CN | 101223640 A | 7/2008 |
| CN | 101292351 A | 10/2008 |
| CN | 101364614 A | 2/2009 |
| CN | 101512729 A | 8/2009 |
| CN | 101847602 A | 9/2010 |
| CN | 105027285 A | 11/2015 |
| CN | 105164808 A | 12/2015 |
| EP | 2973710 A1 | 1/2016 |
| JP | 2007005814 A | 1/2007 |
| JP | 2007294595 A | 11/2007 |
| JP | 2012119445 A | 6/2012 |
| JP | 2012146773 A | 8/2012 |
| JP | 2012227326 A | 11/2012 |
| JP | 2016514371 A | 5/2016 |
| JP | 5965091 B2 | 8/2016 |
| KR | 1020100104908 A | 9/2010 |
| KR | 1020120101818 A | 9/2012 |
| TW | 201442211 A | 11/2014 |
| TW | 201507168 A | 2/2015 |
| TW | 201526207 A | 7/2015 |
| TW | I548065 B | 9/2016 |
| TW | I575716 | 3/2017 |
| WO | WO-2006132158 A1 | 12/2006 |
| WO | WO-2012009140 A2 | 1/2012 |
| WO | WO-2014116864 A1 | 7/2014 |
| WO | WO-2014149740 A1 | 9/2014 |

OTHER PUBLICATIONS

"International Application Serial No. PCT/US2014/012798, Written Opinion mailed May 19, 2014", 11 pgs.
"International Application Serial No. PCT/US2014/020658, International Search Report mailed Jun. 26, 2014", 3 pgs.
"International Application Serial No. PCT/US2014/020658, Written Opinion mailed Jun. 26, 2014", 4 pgs.
"Protrusion", Merriam-Webster Dictionary, 2 pgs.
"Taiwanese Application Serial No. 103102815, Amendment filed Nov. 10, 2014", 52 pgs.
Hang-Ting, Lue, et al., "A Novel Planar Floating-Gate (FG) / Charge Trapping (CT) NAND Device Using BE-SONOS Inter-Poly Dielectric (IPD)", in proceeding of: Electron Devices Meeting (IEDM), (2009), 34.3:1-4.
Kitamura, Takuya, et al., "A Low Voltage Operating Flash Memory Cell with High Coupling Ratio", (1998).
Seo, Moon-Sik, et al., "The 3 dimensional Vertical FG NAND Flash Memory Cell Arrays with the Novel Electrical S/D/ Technique using the Extending Sidewall Contral Gate (ESCG)", 4 pages.
U.S. Appl. No. 14/987,147, filed Jan. 4, 2016, 3D Memory.
"Chinese Application Serial No. 201480013075.1, Preliminary Amendment filed May 30, 2016", W/ English Claims, 48 pgs.
"European Application Serial No. 14743125.8, Extended European Search Report dated Jun. 21, 2016", 8 pgs.
"European Application Serial No. 14743125.8, Preliminary Amendment filed Mar. 9, 2016", 13 pgs.
"European Application Serial No. 14770149.4, Preliminary Amendment filed Apr. 28, 2016", 22 pgs.
"International Application Serial No. PCT/US2014/012798, International Preliminary Report on Patentability dated Aug. 6, 2015", 13 pgs.
"Japanese Application Serial No. 2016-500651, Notice of Rejection mailed Mar. 1, 2016", W/ English Translation, 4 pgs.
"Japanese Application Serial No. 2016-500651, Response filed May 20, 2016 to Notice of Rejection dated Mar. 1, 2016", W/ English Claims, 6 pgs.
"Taiwanese Application Serial No. 104110136, Office Action dated Jan. 26, 2016", W/ English Translation, 3 pgs.
"Taiwanese Application Serial No. 104110136, Response filed Apr. 28, 2016 to Office Action dated Feb. 26, 2016", W/ English Claims, 7 pgs.
"Chinese Application Serial No. 201480013075.1, Office Action dated Sep. 19, 2016", w/English Translation, 10 pgs.
"Chinese Application Serial No. 201480013075.1, Response filed Feb. 3, 2017 to Office Action dated Sep. 19, 2016", w/English Claims, 30 pgs.
"European Application Serial No. 14770149.4, Extended European Search Report dated Nov. 25, 2016", 9 pgs.
"European Application Serial No. 14770149.4, Invitation Pursuant to Rule 62a(1) EPC mailed Aug. 30, 2016", 2 pgs.
"Korean Application Serial No. 10-2015-7029545, Final Office Action dated Mar. 27, 2017", w/English Translation, 6 pgs.
"Korean Application Serial No. 10-2015-7029545, Office Action dated Oct. 18, 2016", w/English Translation, 13 pgs.
"Korean Application Serial No. 10-2015-7029545, Response filed Dec. 18, 2016 to Office Action dated Oct. 18, 2016", w/English Claims, 19 pgs.
"U.S. Appl. No. 14/987,147, Final Office Action dated Apr. 17, 2017", 10 pgs.
"Chinese Application Serial No. 201480024450.2, Office Action dated May 3, 2017", With English Translation, 17 pgs.
"Korean Application Serial No. 10-2015-7029545, Response filed Apr. 25, 2017 to Final Office Action dated Mar. 27, 2017", W/English Claims, 14 pgs.
"Taiwanese Application Serial No. 103109314, Office Action dated Apr. 6, 2017", w/ English Translation, 23 pgs.

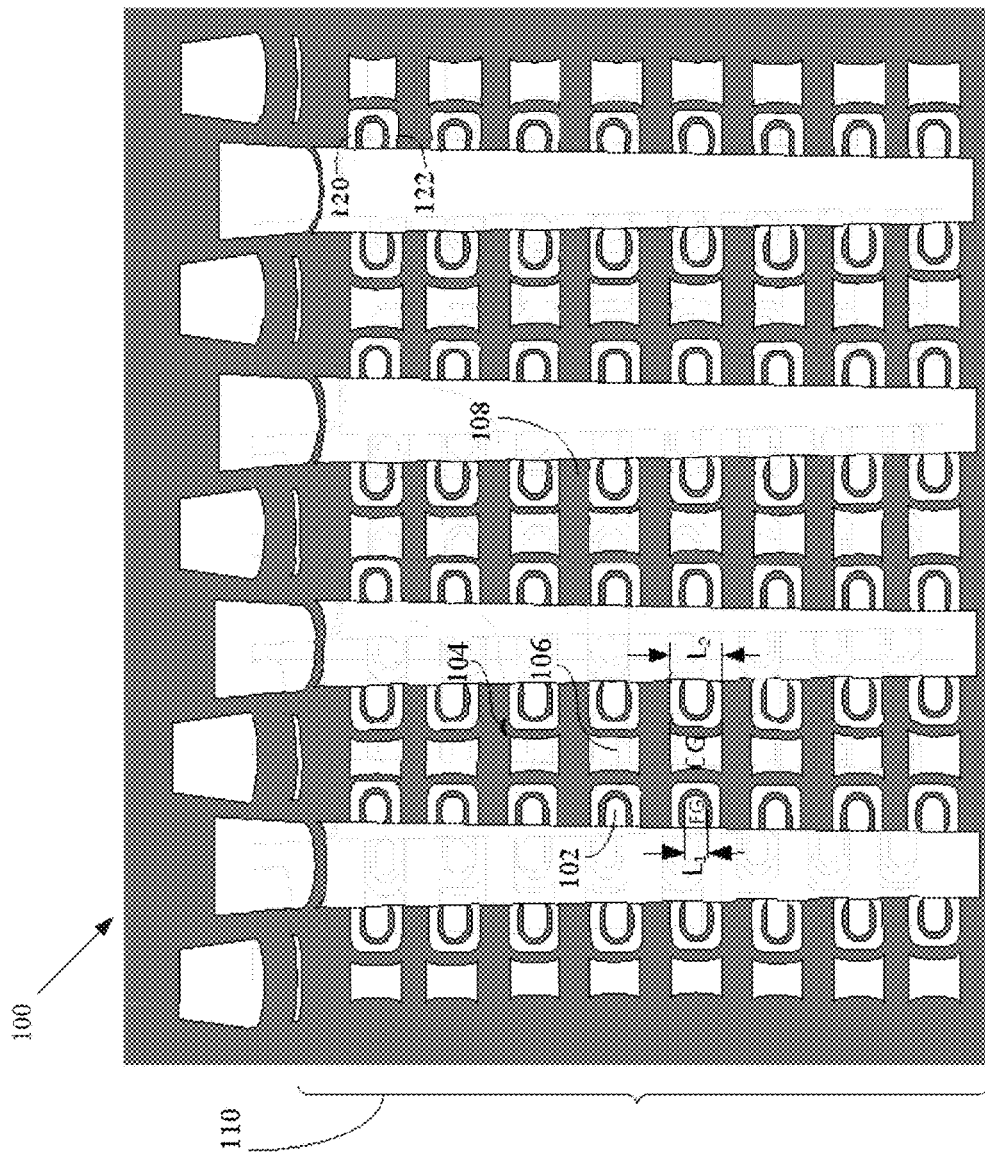

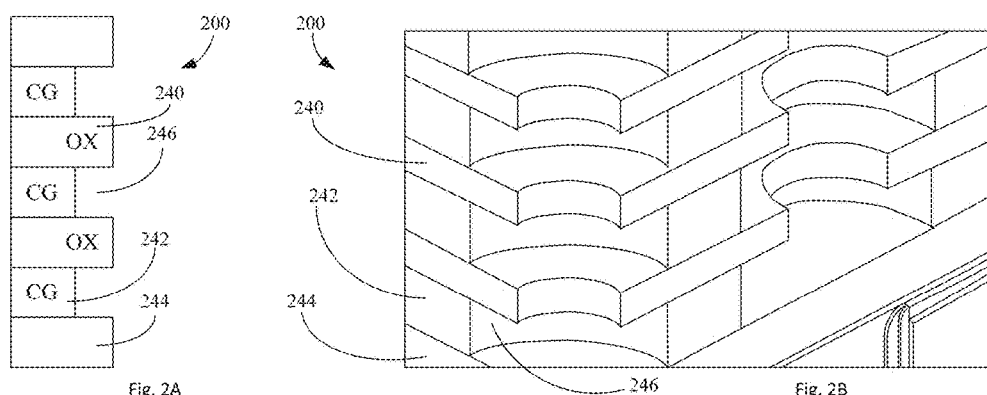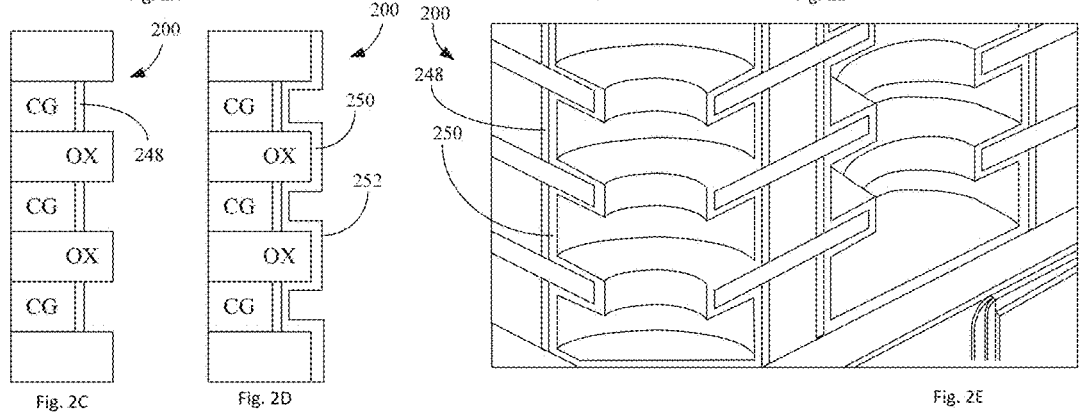

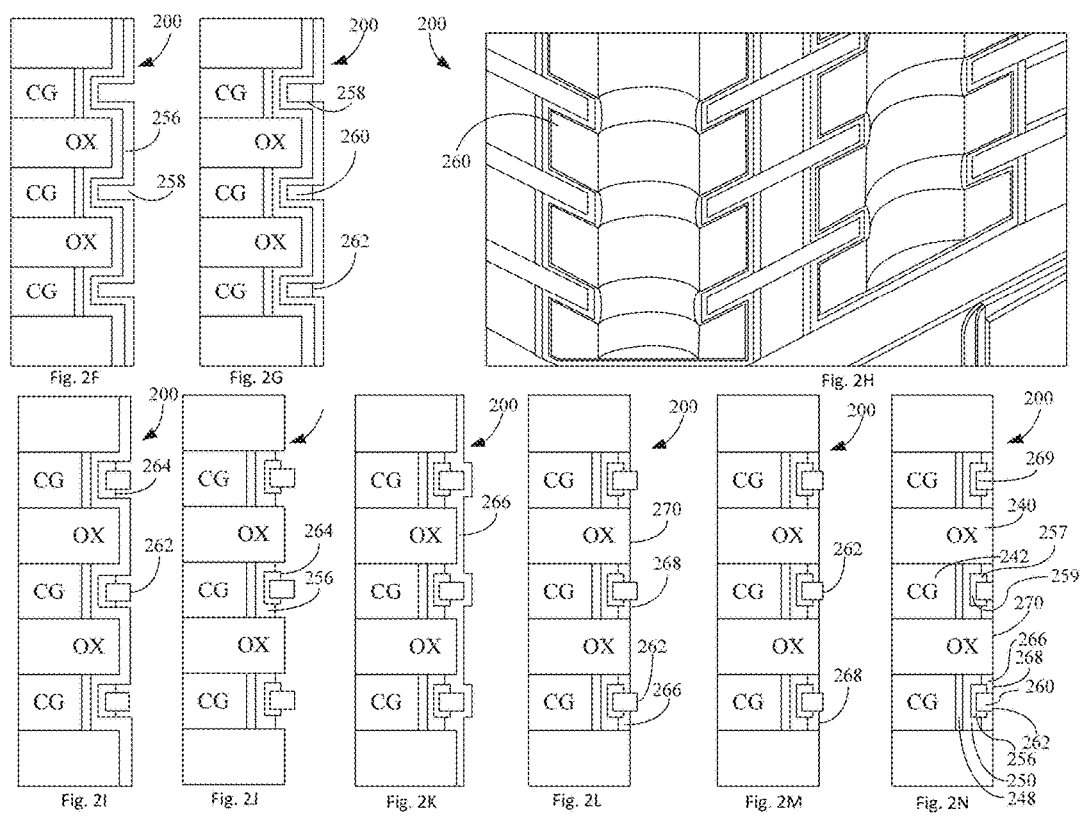

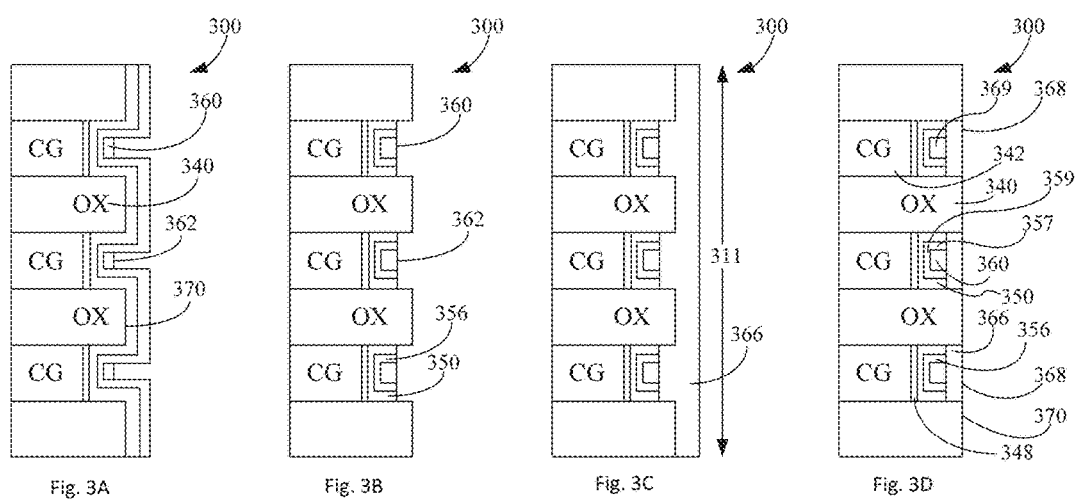

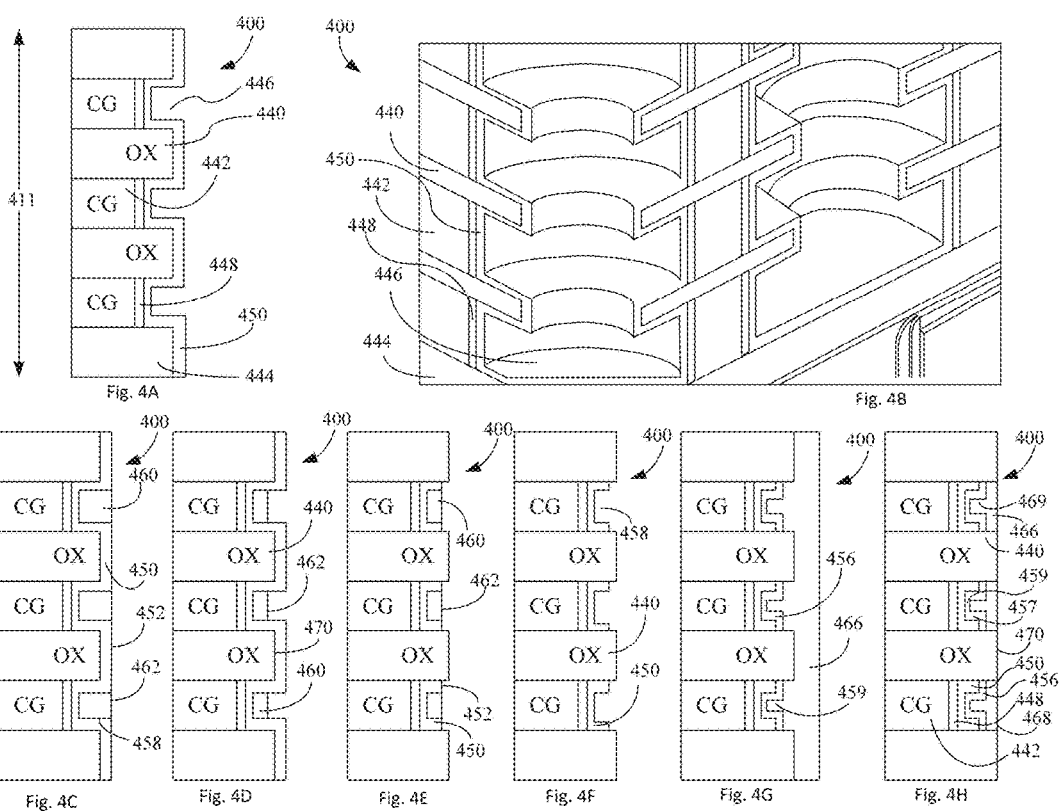

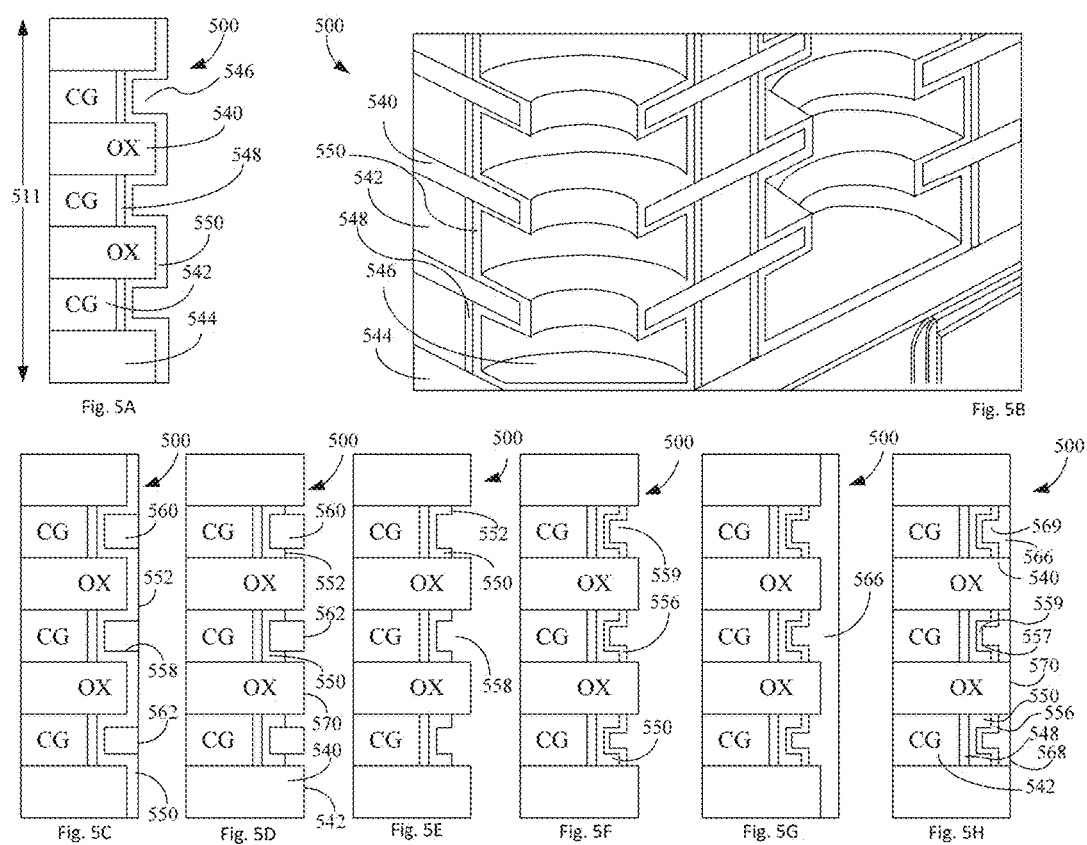

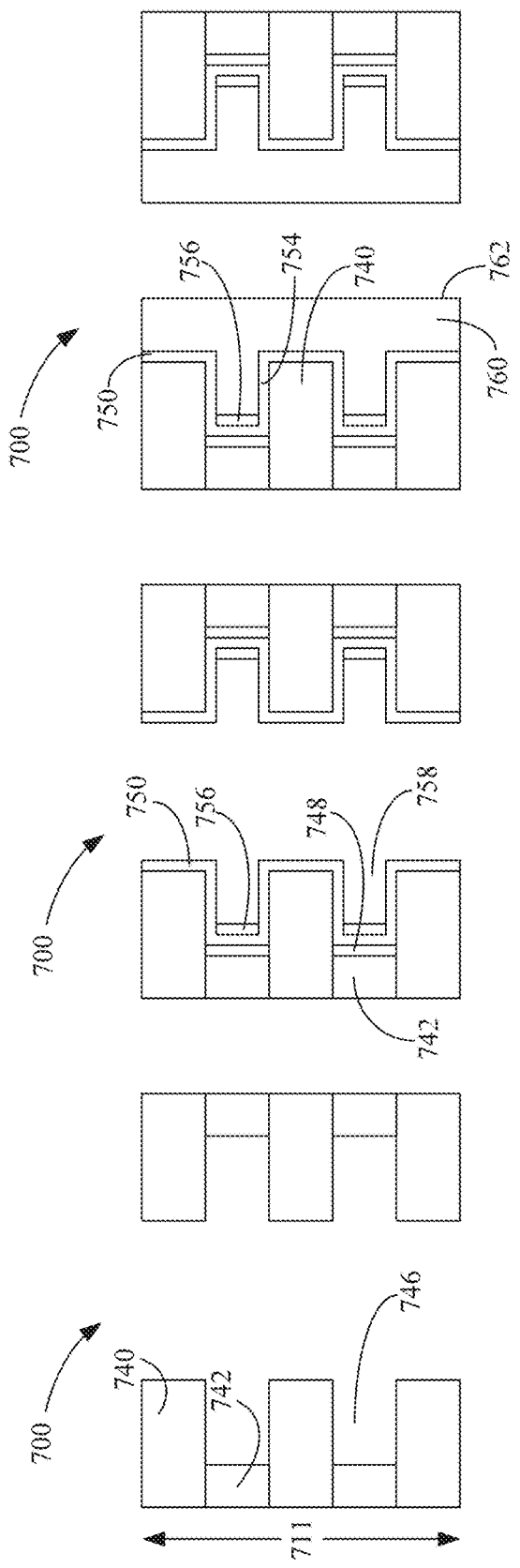

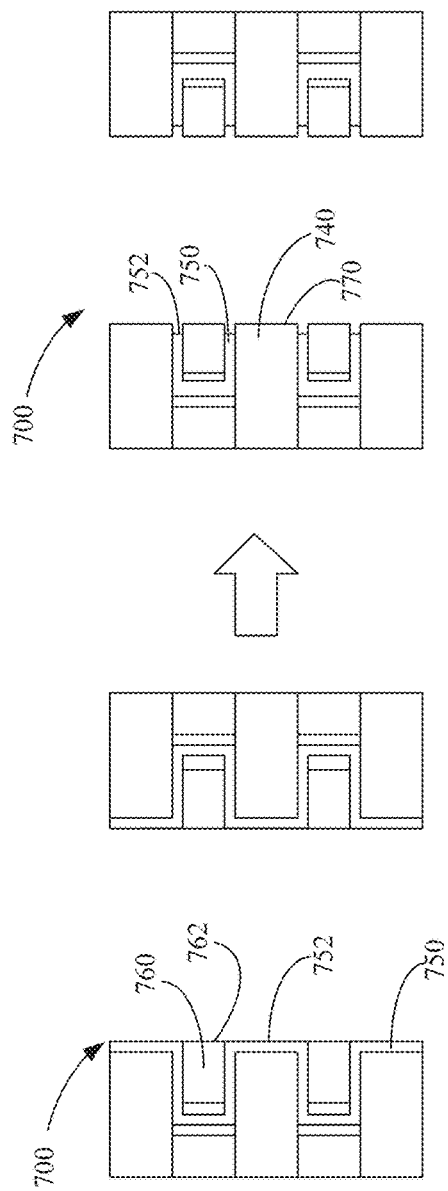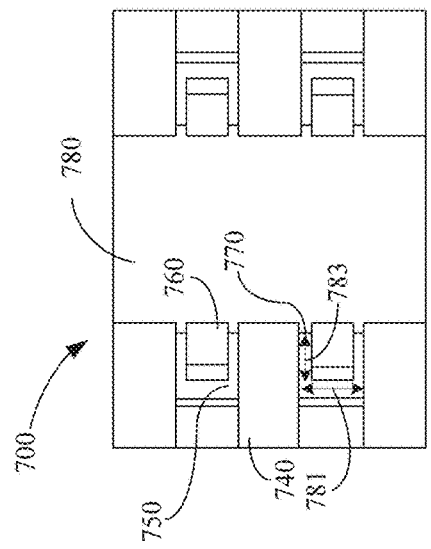

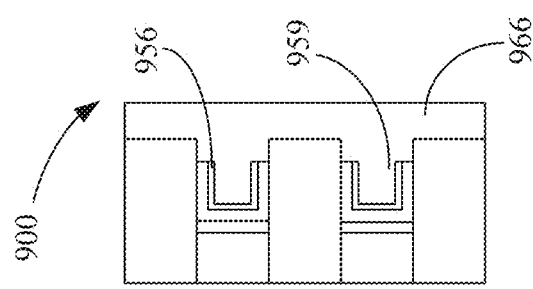
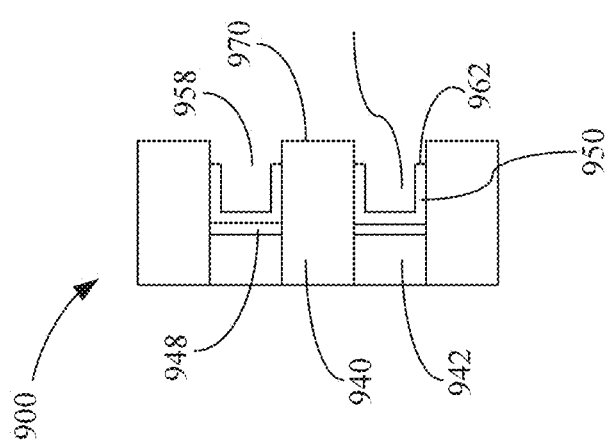

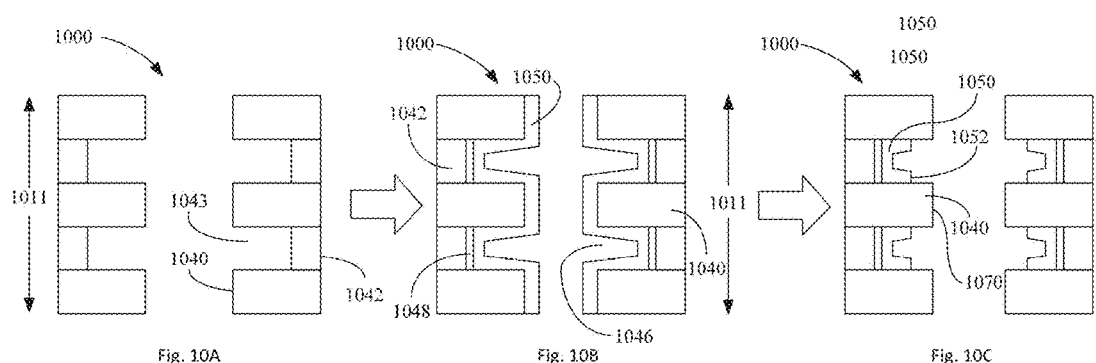
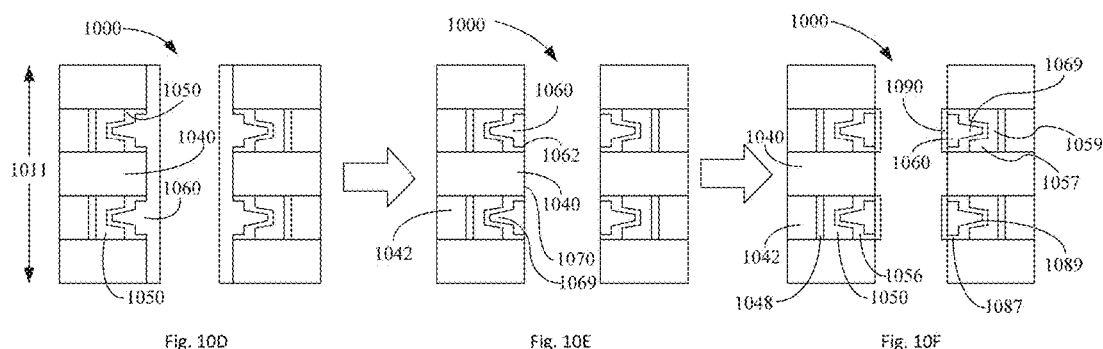

FLOATING GATE MEMORY CELLS IN VERTICAL MEMORY

PRIORITY APPLICATION

This application is a divisional of U.S. application Ser. No. 13/838,297, filed Mar. 15, 2013, which is incorporated herein by reference in its entirety.

BACKGROUND

Semiconductor memory devices that are used for storing data can generally be divided into two classes: volatile memory devices and non-volatile memory devices. Volatile memory devices lose data stored therein when the power supply is interrupted. In contrast, non-volatile memory devices retain the stored data even when the power supply is interrupted. Therefore, nonvolatile memory devices, such as flash memory devices, are widely used in applications where power may be interrupted. For example, power may not be available. Power may occasionally be interrupted or a lower power consumption may be dictated, e.g., in a mobile phone system, a memory card for storing music and/or movie data. With increasing process capability and miniaturization, there is an increased demand for memory cells of a smaller size, even in the flash memory device.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 1 illustrates an example of vertical strings of memory cells in a 3D NAND array architecture;

FIGS. 3A-D illustrate another technique of making a vertical NAND memory according to an embodiment;

FIGS. 4A-H shows one alternative process to reduce or eliminate charge leakage according to an embodiment;

FIGS. 5A-H shows a second alternative process to reduce or eliminate charge leakage according to an embodiment;

FIGS. 7A-F illustrate fabrication of a vertical memory as shown in FIG. 6A according to an embodiment;

FIGS. 9A-D illustrate fabrication of a vertical memory as shown in FIG. 6C according to an embodiment; and FIGS. 10A-F illustrate fabrication of a vertical memory as shown in FIG. 6C according to some embodiments.

DESCRIPTION OF EMBODIMENTS

Figure 2P:
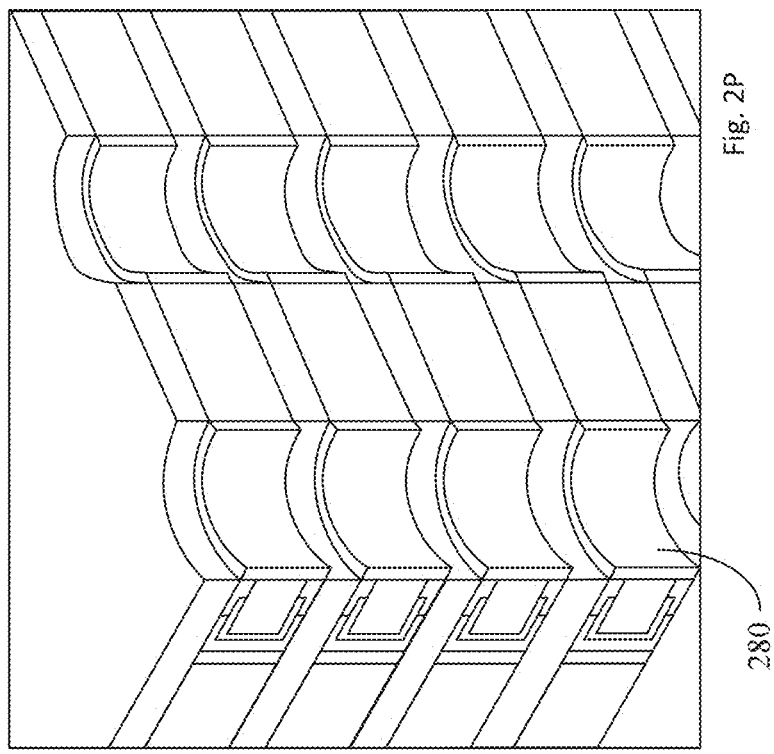
FIGS. 2A-P illustrate a technique of making a vertical NAND memory according to an embodiment.

FIG. 1 illustrates an example of a vertical memory 100 that includes vertical strings of memory cells in a 3D NAND (Not And) architecture, according to what the inventors consider to be a prior internal embodiment. The vertical memory 100 includes a stack of memory cells 110 that includes floating gates (FGs) 102, charge blocking structures (e.g., IPD 104), control gates (CGs) 106, and tiers of dielectric material (e.g., oxide layers 108). In the illustrated example, IPD 104 is disposed between each floating gate (FG) 102 and control gate (CG) 106. Charge can get trapped on portions of the IPD 104, such as on portions of the IPD 104 that laterally extend between a FG 102 and respective tiers of dielectric material. As shown in FIG. 1, the length of a FG 102, i.e., $L_1$, is approximately half of the length of a respective CG 106, i.e., $L_2$. In one embodiment, for example, the length of a FG 102 in the direction of current flow (e.g., in a pillar of a string of the memory cells) is approximately 15 nm compared to the length of a respective CG 106 of approximately 30 nm.

For example, in an embodiment where the IPD 104 of a given memory cell is ONO (oxide-nitride-oxide), the nitride may undesirably trap charge in a first substantially horizontal portion 122 of the nitride and/or in a second substantially horizontal portion 120 of the nitride. Accordingly, embodiments of the present disclosure pare back the IPD 104 (e.g., the nitride of an ONO charge blocking structure) in those areas and/or increase the length of a FG 102 relative to a respective CG 106. Embodiments presented herein include those where, for example, the IPD 104 in a memory cell is recessed and a second floating gate material (e.g., FG2 poly) (not shown in FIG. 1) is used to backfill the recess. For example, in some embodiments, the IPD 104 is mostly recessed from the top and bottom of each of the FGs 102, either by dry, vapor or wet etch, or a combination thereof. Instead of a dielectric deposition, such as an oxide layer deposition, the resulting volume of the recess is instead filled with conductive material to increase the size of each of the FGs 102. For example, in certain embodiments, the length of a FG 102 in the direction of the channel current flow is substantially equal to the length of the respective CG 106 (e.g., as opposed to the length of the FG 102 being equal to the length of the CG 106 minus two times the thickness of the IPD 104, e.g., a nitric oxide (NO) or ONO). For example, the length of the FG 102 and CG 106 may be approximately 30 nm. In at least some of the embodiments, a first (e.g., original) floating gate material (e.g., FG1 poly) is selectively removed and a second layer of oxide of the IPD 104 is formed, and then a second floating gate material (e.g., FG2 poly) is deposited and used to form the FGs 102.

FIGS. 2A-P illustrate a technique of making a vertical NAND memory according to an embodiment. FIG. 2A is a cross-sectional view of a stack of materials 200 including alternating tiers of dielectric material (e.g., oxide layers 240) and control gate material (e.g., tiers of conductive materials, such as doped polysilicon layers 242). FIG. 2B is a perspective view of the stack of materials 200 shown in FIG. 2A. In FIGS. 2A and 2B, the oxide layers 240 and doped polysilicon layers 242 have been etched to form openings extending therethrough, wherein the openings include first recesses 246 adjacent to the doped polysilicon layers 242. Bottom layer 244 is an etch stop layer, such as AlO$_x$.

FIG. 2C is a cross-sectional view of the stack of materials 200 after a first layer (e.g., a first oxide layer 248) of a charge blocking structure is formed (e.g., grown) in each of the recesses 246 adjacent to a respective one of doped polysilicon layers 242.

FIG. 2D is a cross-sectional view of the stack of materials 200 after a second layer 250 (e.g., a nitride layer 250) of a charge blocking structure (which in some embodiments comprises a barrier film) is formed in each of the recesses 246 adjacent to the first oxide layer 248 and adjacent to exposed surfaces of the oxide layers 240 in the openings. The second layer has an inner surface 252. FIG. 2E is a perspective view of the stack of materials 200 shown in FIG. 2D.

FIG. 2F is a cross-sectional view of the stack of materials 200 after a third layer (e.g., a second oxide layer 256) of a charge blocking structure is formed adjacent to the nitride layer 250 in the openings, wherein each of the openings thereafter include second recesses 258 corresponding to the first recesses 246.

FIG. 2G is a cross-sectional view of the stack of materials 200 after a first floating gate (FG1) material (e.g., first polysilicon) is formed in the second recesses 258. For example, in at least some embodiments, the first polysilicon may be deposited in the openings and etched back to recess the first polysilicon in each of the second recesses 258, thereby forming first FG1s 260 with inner surfaces 262. In other embodiments, the first polysilicon may be oxidized, and then the oxide removed to form the first FG1s 260. FIG. 2H is a perspective view of the stack of materials 200 shown in FIG. 2G.

FIG. 2I is a cross-sectional view of the stack of materials 200 after an isotropic etch of the second oxide layer 256 in each of the openings to recess an inner surface 264 of the second oxide layer 256 in each of the openings from the inner surface 262 of the respective first FG1 260. The etch may be a wet etch, a vapor etch or a dry etch, and may be selective to nitride to leave the nitride layer 250 in each of the openings. For example, the second oxide layer 256 may be etched using a dilute hydrogen fluoride (HF) vapor etch.

FIG. 2J is a cross-sectional view of the stack of materials 200 after an isotropic etch of the nitride layer 250 in each of the openings to recess the nitride layer 250 to a depth beyond an inner surface 264 of the second oxide layer 256 in each of the openings. Phosphoric acid can be used as an etchant for the nitride layer 250, which is selective to polysilicon and oxide.

FIG. 2K is a cross-sectional view of the stack of materials 200 after a second floating gate (FG2) material (e.g., second polysilicon 266) is formed in the openings. The second polysilicon 266 may be of the same composition as, or may be of a different composition than, the first polysilicon. The second polysilicon 266 may be deposited using an atomic layer deposition (ALD) technique, such that the deposited polysilicon 266 is highly conformal. In at least some embodiments, the second polysilicon 266 may be implanted with dopants. For example, plasma-doping or other highly conformal doping techniques may be used. In addition, a film deposition and removal technique may be used to remove the deposited film since the wafer is completely covered with polysilicon.

FIGS. 2L-N are cross-sectional views of the stack of materials 200 after the second polysilicon 266 has been etched back in the openings, with FIGS. 2L, 2M and 2N each showing different alternatives for the resulting structure depending on, for example, slight differences in the timing of the etch back. In each of the structures shown in FIGS. 2L-2N, the second polysilicon 266 is etched back in the openings until inner surfaces 268 of the second polysilicon 266 are substantially co-planar with inner surfaces 270 of the oxide layers 240 in the openings. A combination of a first FG1 260 and the etched back second polysilicon 266 (FG2) can collectively form a floating gate, FG, having a protrusion (e.g., corresponding to the first FG1 260) extending towards a control gate, CG.

Accordingly, as shown in FIG. 2N, a memory cell can thus be formed that includes a FG between and in contact with an upper surface of a first tier of dielectric material and a lower surface of a second tier of dielectric material. The FG includes a protrusion extending towards a CG that has also been formed between the upper surface of the first tier of dielectric material and the lower surface of the second tier of dielectric material. A charge blocking structure (e.g., the above described ONO structure) is between the FG and the CG.

The charge blocking structure includes a barrier film, such as a layer of nitride. A substantially vertical portion of the barrier film is between the CG and the FG. A first substantially horizontal portion of the barrier film laterally extends partially between the first tier of dielectric material and the FG. Likewise, a second substantially horizontal portion of the barrier film laterally extends partially between the second tier of dielectric material and the FG. For example, in the embodiment illustrated in FIG. 2N, a first substantially horizontal portion of the barrier film laterally extends to a point such that it is between the protrusion and the first tier of dielectric material, but is not between another portion of the FG and the first tier of dielectric material. In other words, for the other portion of the FG, there is no barrier film between the FG and the first tier of dielectric material.

In the embodiment illustrated in FIG. 2N, at least a portion of the charge blocking structure wraps around at least a portion of the protrusion. For example, a second layer of oxide 256 can wrap around the protrusion. A first portion of the layer of nitride 250 (e.g., the first substantially horizontal portion referred to in the prior paragraph) and a first portion of the second layer of oxide 256 are between the protrusion and an upper surface of the first tier of dielectric material (and are both in contact with the FG. A second portion of the layer of nitride 250 (e.g., the second substantially horizontal portion referred to in the prior paragraph) and a second portion of the second layer of oxide 256 are between the protrusion and a lower surface of the second tier of dielectric material (and are both in contact in with the FG).

In more particular detail, the embodiment shown in FIG. 2N shows a FG that includes three protrusions extending towards a CG: a first protrusion adjacent to the upper surface of the first tier of dielectric material, a second protrusion adjacent to the lower surface of the second tier of dielectric material, and a middle protrusion (e.g., corresponding to the first FG1 260) between the first and second protrusions. As shown in FIG. 2N, in such an embodiment, the first portion of the second layer of oxide 256 can be between the first and middle protrusions, and the second portion of the second layer of oxide 256 can be between the second and middle protrusions.

Thus, a vertical string of memory cells 200 are shown having a memory cell that a control gate 242 between tiers of dielectric material 240 (oxide layers) a floating gate 260/266 between the tiers of dielectric material 240, wherein the floating gate 260/266 includes a protrusion 269 extending towards the control gate 242, and a charge blocking structure (layers 248, 250, 256) between the floating gate 260/266 and the control gate, wherein at least a portion of the charge blocking structure wraps around the protrusion.

The charge blocking structure includes a first layer of oxide 248, a layer of nitride 250 and a second layer of oxide 256, and the charge blocking structure (layers 248, 250, 256) includes a barrier structure (e.g., the second layer of oxide) that wraps around the protrusion 269. A layer of the nitride layer 250 and portions of the second layer of oxide 256 are disposed between the protrusion 269 and a dielectric material 240. The floating gate 266 is in contact with the layer of nitride 250 and the second layer of oxide 256.

Floating gate portion 266 is adjacent to a tier of the dielectric material 240 and, wherein a horizontal portion of the second oxide layer 256 is disposed between protrusion 269 and floating gate portion 266. Floating gate portion 266 contacts a tier of the dielectric material 240. A barrier film of the charge blocking structure, e.g., at least one of layers 248, 250, 256, has a substantially vertical portion disposed between the control gate 242 and the floating gate 260/266 and a first substantially horizontal portion laterally extending partially between a tier of dielectric material 240 and a portion of floating gate 260. The barrier film may be the nitride layer 250. Protrusion 269 is separated from a tier of dielectric material 240 by at least a horizontal portion of the barrier film 250 and the second oxide layer 256.

The second layer of oxide 256 include substantially horizontal portions 257 and a substantially vertical portion 259, wherein a thickness of the substantially vertical portion 259 of the second layer of oxide 256 and the thickness of the horizontal portions 257 of the second layer of oxide 256 are substantially the same. A first portion of the floating gate 260 is separated from the first tier of dielectric material 240 by a substantially horizontal portion of the barrier film 250 and second layer of oxide 256.

Figure 2O:
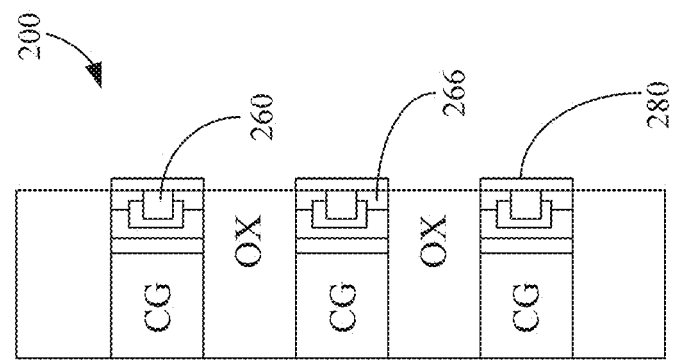

FIG. 2O is a cross-sectional view 228 of the stack of materials 200 (as shown in the embodiment depicted in FIG. 2N) after a tunnel dielectric material (e.g., tunnel oxide layer 280) is formed (e.g., grown) over the exposed surfaces of the first FG1 260 and the etched back second polysilicon 266 in the openings.

FIG. 2P is a perspective view of the stack of materials 200 shown in FIG. 2O. Relative to a memory cell in the structure shown in FIG. 1, any top and/or bottom parasitic SONOS devices (relative to the memory cell) may be pared back and the length of the FG is substantially doubled, e.g., from approximately 15 nm to approximately 30 nm, so that the floating gate is substantially the same length as the control gate.

FIGS. 3A-D illustrate another technique of making a vertical NAND memory according to an embodiment. FIGS. 3A-D begin after the process shown in FIG. 2G.

FIG. 3A is a cross-sectional view of a stack of materials 300, corresponding to the stack of memory cells 200 shown in FIG. 2G, showing the results of continuing the isotropic etch to further recess inner surfaces 362 of the first FG1s 360 into the first recesses (246).

FIG. 3B is a cross-sectional view of the stack of materials 300 after the second oxide layer 356 and nitride layer 350 have been etched back until exposed surfaces of the nitride layer 350 and the second oxide layer 356 in the openings are substantially co-planar with the inner surfaces 362 of the first FG1s 360. In at least some embodiments, for example, the second layer of oxide 356 may be etched selective to nitride, then the nitride layer 350 may be etched (e.g., using phosphoric acid) selective to polysilicon and oxide. The etches may be wet etches, vapor etches or dry etches, or combinations thereof.

FIG. 3C is a cross-sectional view of the stack of materials 300 after a second floating gate (FG2) material (e.g., second polysilicon 366) is formed in the openings and covering the length 311 of stack of materials 300. The second polysilicon 366 may be of the same composition as, or may be of a different composition than, the first polysilicon.

FIG. 3D is a cross-sectional view of the stack of materials 300 after the second polysilicon 366 has been etched back in the openings until inner surfaces 368 of the second polysilicon 366 are substantially co-planar with inner surfaces 370 of the oxide layers 340. A combination of a first FG1 360 and the etched back second polysilicon 366 (FG2) can collectively form a floating gate, FG, having a protrusion (e.g., corresponding to the first FG1 360) extending towards a control gate, CG. In contrast to the structure shown in FIG. 2N, in the structure shown in FIG. 3D, a FG has one protrusion extending towards the CG.

Thus, a vertical string of memory cells 300 are shown having a memory cell having a control gate 342 between tiers of dielectric material 340 (oxide layers), a floating gate 360/366 between the tiers of dielectric material 340, wherein the floating gate 360/366 includes a protrusion 369 extending towards the control gate 342, and a charge blocking structure (layers 348, 350, 356) between the floating gate 360/266 and the control gate 342, wherein at least a portion of the charge blocking structure (layers 348, 350, 356) wraps around the protrusion 369.

The charge blocking structure includes a first layer of oxide 348, a layer of nitride 350 and a second layer of oxide 356, and the charge blocking structure (layers 348, 350, 356) includes a barrier structure (e.g., the second layer of oxide 356 and/or nitride layer 350) that wraps around the protrusion 369. A layer of the nitride layer 350 and portions of the second layer of oxide 356 are disposed between the protrusion 369 and a dielectric material 340.

The floating gate 366 is in contact with the layer of nitride 350 and the second layer of oxide 356. Floating gate portion 366 contacts a tier of the dielectric material 340. Only protrusion 369 of floating gate 360/266 extends toward the control gate 342. A barrier film of the charge blocking structure, e.g., at least one of layers 348, 350, 356, has a substantially vertical portion disposed between the control gate 342 and the floating gate 360/366 and a first substantially horizontal portion laterally extending partially between a tier of dielectric material 340 and a portion of floating gate 360. The barrier film may be the nitride layer 350.

Protrusion 369 is separated from a tier of dielectric material 340 by at least a horizontal portion of the barrier film 350 and the second oxide layer 356. The second layer of oxide 356 include first and second substantially horizontal portions 357 and a substantially vertical portion 359, wherein a thickness of the substantially vertical portion 359 of the second layer of oxide 356 and the thickness of the horizontal portions 357 of the second layer of oxide 356 are substantially the same. A first portion of the floating gate 360 is separated from the first tier of dielectric material 340 by a substantially horizontal portion of the barrier film 350 and second layer of oxide 356.

In some cases, the structures illustrated in FIGS. 2A-P and FIGS. 3A-D may be susceptible to a potentially negative condition. For example, as shown in FIG. 3D, there is a thin oxide layer 348, nitride layer 350, and second oxide layer 356 separating the CG from the FG. At least a portion of the charge blocking structure wraps around at least a portion of the protrusion (e.g., nitride layer 350 and second layer of oxide 256 wrap around protrusion formed by first FG1 360. A combination of a first FG1 360 and the etched back second polysilicon 366 (FG2) can collectively form a floating gate, FG, having a protrusion (e.g., corresponding to the first FG1 360) extending towards a control gate, CG. However, even when the nitride layer 350 is relatively thick, charge leakage may still occur.

FIGS. 4A-H and FIGS. 5A-G show two alternative processes that address the above condition. The processes illustrated by FIGS. 4A-G and FIGS. 5A-G begin after a second layer 450, 550, respectively (e.g., a nitride layer) of a charge blocking structure (which in some embodiments comprises a barrier film) is formed in recesses adjacent to the first oxide layer 448, 548, respectively, and adjacent to exposed surfaces of the oxide layers 440, 540, respectively.

FIG. 4A is a cross-sectional view of a stack of materials 400 including alternating tiers of dielectric material (e.g., oxide layers 440) and control gate material (e.g., tiers of conductive materials, such as doped polysilicon layers 442). In FIG. 4A, a charge blocking structure is formed including a first oxide layer 448 formed substantially vertical over the recessed CG layer 442 and a second layer 450 (e.g., a nitride layer), which in some embodiments comprises a barrier film) formed over the length of the full pillar 411. Unlike FIGS. 2A-F and 3A, the second oxidation step is not performed after deposition of the pillar nitride 450. The second layer 450 (e.g., a nitride layer) may be formed in each of the recesses 446 adjacent to the first oxide layer 448 and adjacent to exposed surfaces of the oxide layers 440 in the openings.

FIG. 4B is a perspective view of a stacked cell 400 showing the formation of the alternating oxide layers 440, control gate layer 442, first recess 446, first oxide layer 448 and the nitride layer 450. First oxide layer 448 and the nitride layer 450 are formed (e.g., grown) to create a charge blocking structure. In FIGS. 4A and 4B, openings, include first recesses 446 adjacent to the doped polysilicon layers 442, have been formed extending therethrough. Bottom layer 444 may be an etch stop layer, such as $AlO_x$.

FIG. 4C is a cross-sectional view of the stack of materials 400 after a first floating gate (FG1) material (e.g., first polysilicon) is formed in the first recesses 446 shown in FIGS. 4A-B. For example, in at least some embodiments, the first polysilicon 460 may be deposited in the openings and etched back to recess the first polysilicon in each of the first recesses 446, thereby forming first FG1s 460 with inner surfaces 462. The inner surface 462 of the first FG layer 460 may be etched even with the inner surface 452 of the second layer 450 (e.g., nitride layer). Alternatively, any disposable layer with appropriate good conformal deposition may be used.

FIG. 4D is a cross-sectional view of the stack of materials 400 after etching the first FG layer 460 to recess the inner surface 462 of the first FG/disposable layer 460 beyond the inner surface 470 of the tiered oxide layer 440. An etchant selective to nitride may be used to etch the first FG/disposable layer 460.

FIG. 4E is a cross-sectional view of the stack of materials 400 after an isotropic etch of the nitride layer 450 in each of the openings is performed to recess the nitride layer 450 to a depth beyond an inner surface 462 of the first FG/disposable layer 460 in each of the openings. Phosphoric acid can be used as an etchant for the nitride layer 450, which is selective to polysilicon and oxide.

FIG. 4F is a cross-sectional view of the stack of materials 400 after removal of the FG/disposable layer 460 via etching, e.g., wet, dry or vapor etching. A second recess 458 is left between the nitride layer 450 and the tier oxide layer 440.

FIG. 4G is a cross-sectional view of the stack of materials 400 after forming a second oxidation layer 456 to complete the ONO layer. FIG. 4G also illustrates deposition of polysilicon over the length of the full pillar 411 for the second FG layer 466. The polysilicon for the second FG layer 466 may optionally be doped.

FIG. 4H is a cross-sectional view of the stack of materials 400 after isolating the second FG layer 466 by etching or oxidation until inner surface 468 of the second FG layer 466 is substantially even with the inner surface 470 of the tiered oxide layer 440. An etchant selective to oxide may be used to etch the second FG layer 466. The second FG 466 includes a protrusion 469 extending towards a CG 442 that has also been formed in a third recess 459.

In FIG. 4H, a vertical string of memory cells 400 is shown having a memory cell with a control gate 442 disposed between tiers of dielectric material 440 (oxide layers) a floating gate 466 between the tiers of dielectric material 440, wherein the floating gate 466 includes a protrusion 469 extending towards the control gate 442, and a charge blocking structure (layers 448, 450, 456) between the floating gate 466 and the control gate 442, wherein at least a portion of the charge blocking structure (e.g., nitride layer 450 and/or second oxide layer 456) wraps around the protrusion 469.

The charge blocking structure includes a first layer of oxide 448, a layer of nitride 450 and a second layer of oxide 456, and the charge blocking structure (layers 448, 450, 456) includes a barrier structure (e.g., e.g., nitride layer 450 and/or second oxide layer 456) that wraps around the protrusion 469. A layer of the nitride 450 and portions of the second layer of oxide 456 are disposed between the protrusion 469 and a dielectric material 440. The second layer of oxide 456 completely separates the layer of nitride 450 from the floating gate 466. The floating gate 466 is in contact with the second oxide layer 456 and is not in contact with the nitride layer 450.

Floating gate portion 466 contacts a tier of the dielectric material 440. Only protrusion 469 of floating gate 466 extends toward the control gate 442. A barrier film of the charge blocking structure, e.g., at least one of layers 448, 450, 456, has a substantially vertical portion disposed between the control gate 442 and the floating gate 466 and a first substantially horizontal portion laterally extending partially between a tier of dielectric material 440 and a portion of floating gate 466. The barrier film may be the nitride layer 450.

Protrusion 469 is separated from a tier of dielectric material 440 by the second oxide layer 456, or by a horizontal portion of the barrier film 450 and the second oxide layer 456. The second layer of oxide 456 include first and second substantially horizontal portions 457 and a substantially vertical portion 459, wherein a thickness of the substantially vertical portion 459 of the second layer of oxide 456 and the thickness of the horizontal portions 459 of the second layer of oxide 456 are substantially the same. A first portion of the floating gate 466 is separated from the first tier of dielectric material 440 by a substantially horizontal portion of the second layer of oxide 456. Another portion of the floating gate 466 is separated from the first tier of dielectric material 440 by the substantially horizontal portion of the barrier film 450 and a first portion of the second layer of oxide 456.

FIGS. 5A-H illustrate formation of a stack of materials 500 according to an embodiment. FIGS. 5A-H begin after deposition of the pillar oxide as shown in FIG. 2D. FIG. 5A is a cross-sectional view of a stack of materials 500 including alternating tiers of dielectric material (e.g., oxide layers 540) and control gate material (e.g., tiers of conductive materials, such as doped polysilicon layers 542). In FIG. 5A, a charge blocking structure is formed including a first oxide layer 548 formed substantially vertical over the recessed CG layer 542 and a second layer 550 (e.g., a nitride layer), which in some embodiments comprises a barrier film) formed over the length of the full pillar 511. Unlike FIGS. 2A-F and 3A, the second oxidation step is not performed after deposition of the pillar nitride 550. The second layer 550 (e.g., a nitride layer) may be formed in each of the recesses 546 adjacent to the first oxide layer 548 and adjacent to exposed surfaces of the oxide layers 540 in the openings.

FIG. 5B is a perspective view of a stacked cell 500 showing the formation of the alternating oxide layers 540, control gate layer 542, first recess 546, first oxide layer 548 and the nitride layer 550. First oxide layer 548 and the nitride layer 550 are formed (e.g., grown) to create a charge blocking structure. In FIGS. 5A and 5B, openings, include first recesses 546 adjacent to the doped polysilicon layers 542, have been formed extending therethrough. Bottom layer 544 may be an etch stop layer, such as $AlO_x$.

FIG. 5C is a cross-sectional view of the stack of materials 500 after a first floating gate (FG1) material (e.g., first polysilicon) is formed in the first recesses 546 shown in FIGS. 5A-B. For example, in at least some embodiments, the first polysilicon 560 may be deposited in the openings and etched back to recess the first polysilicon in each of the first recesses 546, thereby forming first FG1s 560 with inner surfaces 562. The inner surface 562 of the first FG layer 560 may be etched even with the inner surface 552 of the second layer 550 (e.g., nitride layer). Alternatively, any disposable layer with appropriate good conformal deposition may be used.

FIG. 5D is a cross-sectional view of the stack of materials 500 after etching the first FG layer 560 to recess the inner surface 562 of the first FG/disposable layer 560 even with the inner surface 570 of the tiered oxide layer 540 and after etching the inner surface 552 of the second layer 550 (e.g., nitride layer) beyond the inner surface 570 of the tiered oxide layer 540. An etchant selective to polysilicon and an etchant selective to nitride may be used to etch the first FG/disposable layer 560 and the nitride layer, respectively.

FIG. 5E is a cross-sectional view of the stack of materials 500 after removal of the FG/disposable layer 560 via etching, e.g., wet, dry or vapor etching. A second recess 558 is left between the nitride layer 550 and the tier oxide layer 540.

FIG. 5F is a cross-sectional view of the stack of materials 500 after forming a second oxidation layer 556 to complete the ONO layer. The formation of the second oxidation layer 556 results in a third recess 559.

FIG. 5G is a cross-sectional view of the stack of materials 500 after deposition of polysilicon over the length of the full pillar 511 and in the third recess 559 for the second FG layer 566. The polysilicon for the second FG layer 566 may optionally be doped.

FIG. 5H is a cross-sectional view of the stack of materials 500 after isolating the second FG layer 566 by etching or oxidation until inner surface 568 of the second FG layer 566 is substantially even with the inner surface 570 of the tiered oxide layer 540. An etchant selective to oxide may be used to etch the second FG layer 566 even with the inner surface 570 of the tiered oxide layers 540. The second FG 566 includes a protrusion 569 extending towards a CG 542 that has also been formed in a third recess 559.

In FIG. 5H, a vertical string of memory cells 500 is shown having a memory cell with a control gate 542 disposed between tiers of dielectric material 540 (oxide layers) a floating gate 566 between the tiers of dielectric material 540, wherein the floating gate 566 includes a protrusion 569 extending towards the control gate 542, and a charge blocking structure (layers 548, 550, 556) between the floating gate 566 and the control gate 542, wherein at least a portion of the charge blocking structure (e.g., nitride layer 550 and/or second oxide layer 556) wraps around the protrusion 569.

The charge blocking structure includes a first layer of oxide 548, a layer of nitride 550 and a second layer of oxide 556, and the charge blocking structure (layers 548, 550, 556) includes a barrier structure (e.g., e.g., nitride layer 550 and/or second oxide layer 556) that wraps around the protrusion 569. A layer of the nitride 550 and portions of the second layer of oxide 556 are disposed between the protrusion 569 and a dielectric material 540. The second layer of oxide 556 completely separates the layer of nitride 550 from the floating gate 566. The floating gate 566 is in contact with the second oxide layer 556 and is not in contact with the nitride layer 550.

Floating gate portion 566 contacts a tier of the dielectric material 540. Only protrusion 569 of floating gate 566 extends toward the control gate 542. A barrier film of the charge blocking structure, e.g., at least one of layers 548, 550, 556, has a substantially vertical portion disposed between the control gate 542 and the floating gate 566 and a first substantially horizontal portion laterally extending partially between a tier of dielectric material 540 and a portion of floating gate 566. The barrier film may be the nitride layer 550.

Protrusion 569 is separated from a tier of dielectric material 540 by the second oxide layer 556, or by a horizontal portion of the barrier film 550 and the second oxide layer 556. The second layer of oxide 556 include first and second substantially horizontal portions 557 and a substantially vertical portion 559, wherein a thickness of the substantially vertical portion 559 of the second layer of oxide 556 and the thickness of the horizontal portions 559 of the second layer of oxide 556 are substantially the same. A first portion of the floating gate 566 is separated from the first tier of dielectric material 540 by a substantially horizontal portion of the second layer of oxide 556. Another portion of the floating gate 566 is separated from the first tier of dielectric material 540 by the substantially horizontal portion of the barrier film 550 and a first portion of the second layer of oxide 556.

The embodiments described above with reference to FIGS. 2A-P, FIGS. 3A-D, FIGS. 4A-H, and FIGS. 5A-H, illustrate embodiments where, at least relative to a memory cell in the structure shown in FIG. 1, any top and/or bottom parasitic SONOS devices (relative to the memory cell) may be pared back and the length of the FG is substantially doubled (and may now be substantially equal to the length of the CG). The lengthened FG will potentially provide more impact on modulating the NAND string current, e.g., due to the longer FG and the absence or minimization of parasitic SONOS devices A negative impact may include a reduction in the gate coupling ratio (CGR). In simulation, the GCR was reduced from 38% to 31.4%. However, this reduction may be decreased, i.e., the CGR increased, by increasing the etchback of the dielectric layer to form sidewalls. The etchback of the dielectric may be increased from 50% of the dielectric to 75%. This reduction in GCR results in higher $V_gV_t$ and $V_wV_t$, where $V_g$ is the gate voltage, $V_t$ is the threshold voltage, and Vw is the writing voltage.

In at least some of the embodiments, FG area is increased significantly and two potential parasitic SONOS devices, and the direct injection path they provide for electrons moving from the CG to the channel, are reduced or eliminated. Increasing the FG length in the direction of NAND channel may result in a higher degree of channel conductance modulation (e.g., a higher on/off ratio), noise reduction (e.g., a larger FG) and reliability gain due to replacement of the two SiN regions impacting NAND channel conductance with a larger FG (e.g., approximately two times longer in the channel length direction). Further, the structures reduce or eliminate two parasitic currents: the CG-AA (active area)

and at the boundary of the FG and the interpoly dielectric (IPD) devices. Both may cause nitride trapping.

If diagonal FG-AA current occurs, which is current between the FG edge to the LDD region, trapping is degraded. However, a thinner oxide under SiN might provide an undesirable tradeoff, because more SiN would be in the FG to LDD current path, leading to additional SiN trapping. An edge E-field increase due to SiN at the edge modulating fringe E-field may increase this parasitic current and is also undesirable.

The larger FG length in a recessed cell may reduce cell noise, such as forward-tunneling voltage (FTV) and reverse-tunneling voltage (RTV). For example, if GCR=CIPD/(CIPD+CTUNOX), where CTUNOX is the capacitance across a tunnel oxide layer and CIPD refers to the capacitance across the control-dielectric or the IPD. The recessed cells may have a larger CTUNOX, and a larger CIPD. Since the CTUNOX increase is more significant, the GCR is reduced. This is a $V_t$ window loss and a $V_{pgm}$/erase increase, where $V_{pgm}$ is the program voltage. The program voltage $V_{pgm}$ is applied to a word line (WL) to program memory cells. Since capacitances increase, noise may be be smaller. The more uniform E-field in the tiered oxide (TO) of the recessed cell may provide a reliability (cycling degradation) gain. Accordingly, the GCR loss and noise improvement can be configured to obtain a net gain with respect to functionality and reliability.

Figure 6C:
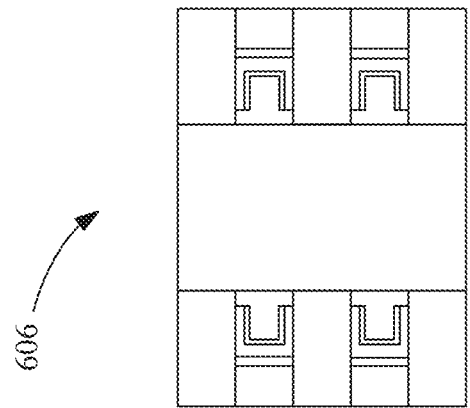
FIGS. 6A-C illustrates three additional vertical memories embodiments.
Figure 6B:
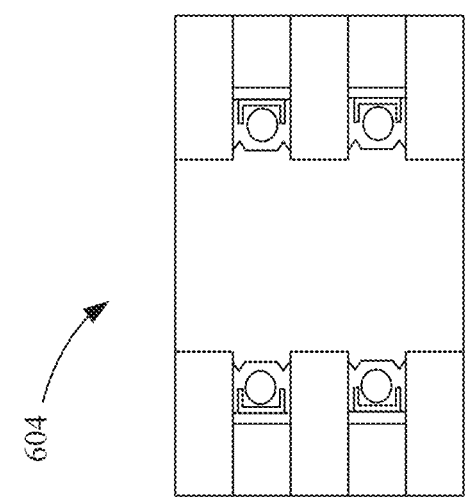
Figure 6A:
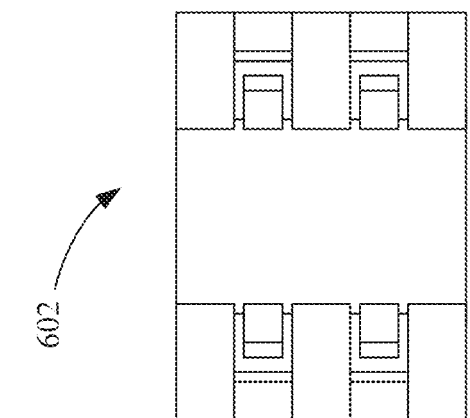

FIGS. 6A-C illustrates three additional vertical NAND memories 602, 604, 606 formed according to methods described herein below according to various embodiments. FIGS. 7A-F illustrate fabrication of a vertical memory as shown in FIG. 6A according to an embodiment.

FIG. 7A is a cross-sectional view of a stack of materials 700 including alternating tiers of dielectric material (e.g., oxide layers 740) and control gate material (e.g., tiers of conductive materials, such as doped polysilicon layers 742) to form a pillar 711. The CG layer 742 is etched to a predetermined depth to create a first recess area 746 between the tiered oxide layers 740.

FIG. 7B is a cross-sectional view of the stack of materials 700 after a charge blocking structure is formed. In FIG. 7B, the charge blocking structure includes a first oxide layer 748 formed substantially vertical over the recessed CG layer 742 and a second layer 750 (e.g., a nitride layer), which in some embodiments comprises a barrier film) formed over the length of the full pillar 711. The second layer 750 (e.g., a nitride layer) may be formed in each of the recesses 746 adjacent to the first oxide layer 748 and adjacent to exposed surfaces of the oxide layers 740 in the openings. A second oxide layer 756 is formed substantially vertical over the second layer 750 (e.g., a nitride layer) to form second recess 758.

FIG. 7C is a cross-sectional view of the stack of materials 700 after deposition of polysilicon over the length of the full pillar 711 for a FG layer 760. The FG layer 760 fills the recess 758 (shown in FIG. 7B) between the tiered oxide layers 740 and over the horizontal portions of the nitride layer 754 and over the substantially vertical second oxide layer 756. The FG layer 760 includes an inner surface 762. The polysilicon for the FG layer 760 may optionally be doped.

FIG. 7D is a cross-sectional view of the stack of materials 700 after the FG layer 760 (e.g., polysilicon) is made even with the inner surface 752 of the second layer 750 (e.g., nitride layer). The FG layer 760 may be made even with the inner surface 752 of the second layer 750 (e.g., nitride layer) using an oxide decapping step followed with hot phosphoric acid etch.

FIG. 7E is a cross-sectional view of the stack of materials 700 after etching the inner surface 752 of the second layer 750 (e.g., nitride layer) beyond the inner surface 770 of the tiered oxide layer 740. An etchant selective to polysilicon and an etchant selective to oxide may be used to etch the nitride layer 750.

FIG. 7F is a cross-sectional view of the stack of materials 700 after deposition of a channel material 780. The channel material is conformal to the inner surface 770 of the nitride layer 750.

Accordingly, in FIG. 7F, floating gate 760 is separated from a tier of dielectric material 740 by the horizontal portion of the barrier film, e.g., the nitride layer 750. A thickness of the substantially vertical portion 781 of the barrier film 750 is greater than a thickness of the substantially horizontal portions 783 of the barrier film 750.

Figure 8:
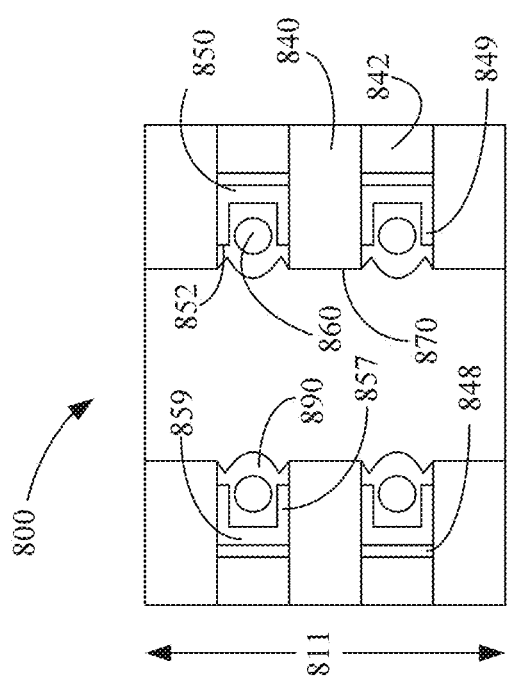
FIG. 8 illustrates a vertical memory as shown in FIG. 6B according to an embodiment.

FIG. 8 illustrates a vertical NAND cell 800 as shown in FIG. 6B according to an embodiment. FIG. 8 shows the vertical memory cell 802 with the alternating layers of tiered oxide 840 and polysilicon tiered control gate (CG) layers 842 to form a pillar 811. The CG layer 842 is etched to a predetermined depth to create a first recess area between the tiered oxide layers 840. An oxide layer 848 and a nitride layer 850 are formed over the recessed CG layer 842. A polysilicon floating gate (FG) layer 860 is formed in the recess between the horizontal portions 849 of the nitride layer 850. A TuO$_x$ layer or second oxide layer 890 is formed over the FG layer 860. While the FG layer 860 is shown substantially circular, those skilled in the art will recognize that the FG layer may be rectangular as illustrated in at least FIGS. 7A-F. The inner surface 852 of the second layer 850 (e.g., nitride layer) is etched beyond the inner surface 870 of the tiered oxide layer 840.

In FIG. 8, the second layer of oxide 890 completely separates the layer of nitride 850 from the floating gate 860. The floating gate 860 is in contact with the second oxide layer 890 and is not in contact with the nitride layer 850. A barrier film of the charge blocking structure, e.g., at least one of layers 848, 850, 890, has a substantially vertical portion 859 disposed between the control gate 842 and the floating gate 860 and substantially horizontal portions 857 laterally extending partially between a tier of dielectric material 840 and a portion of floating gate 860. The barrier film may be the nitride layer 850. The floating gate 860 is separated from the first tier of dielectric material 240 by the substantially horizontal portion 859 of the barrier film 250 and the second oxide layer 890.

FIGS. 9A-D illustrate fabrication of a vertical memory cell 606 as shown in FIG. 6C according to an embodiment. For the fabrication of the vertical memory cell 606 as shown in FIG. 6C, the initial processes are similar to those shown in FIGS. 7A-D.

FIG. 9A is a cross-sectional view of a stack of materials 900 including alternating tiers of dielectric material (e.g., oxide layers 940) and control gate material (e.g., tiers of conductive materials, such as doped polysilicon layers 942). In FIG. 9A, a charge blocking structure is formed including a first oxide layer 948 formed substantially vertical over the recessed CG layer 942 and a second layer 950 (e.g., a nitride layer), which in some embodiments comprises a barrier film) formed over the length of the full pillar 911. The second layer 950 (e.g., a nitride layer) may be formed adjacent to the first oxide layer 948. The second layer 950 may be formed by depositing the second layer 950 along the full length of the pillar and then etching the second layer 950 to recess the inner surface 962 of the second layer 950 beyond the inner surface 970 of the tiered oxide layer 940 forming recess 958. An etchant selective to oxide may be used to etch the second layer 950.

FIG. 9B is a cross-sectional view of the stack of materials 900 after forming a second oxidation layer 956 to complete the ONO layer. The formation of the second oxidation layer 956 results in a second recess 959. A polysilicon layer is deposited over the length of the full pillar 411 for the second FG layer 966. The polysilicon for the second FG layer 966 may optionally be doped.

Figure 9D:
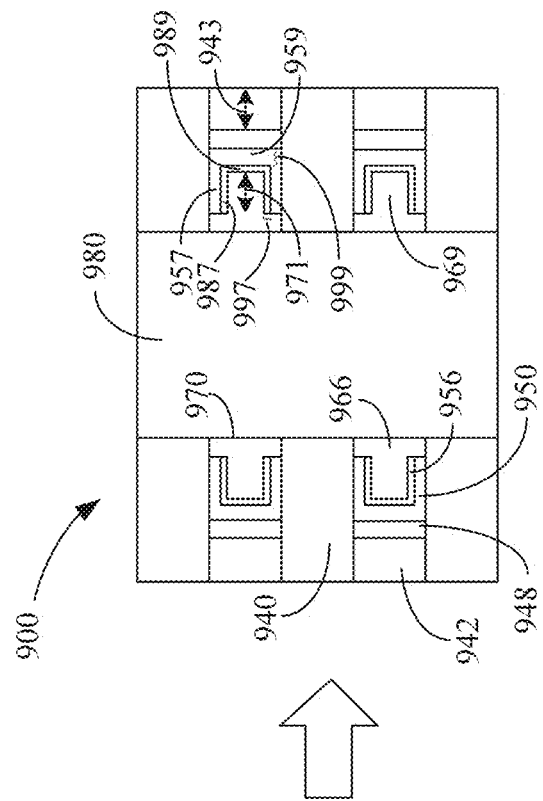
Figure 9C:
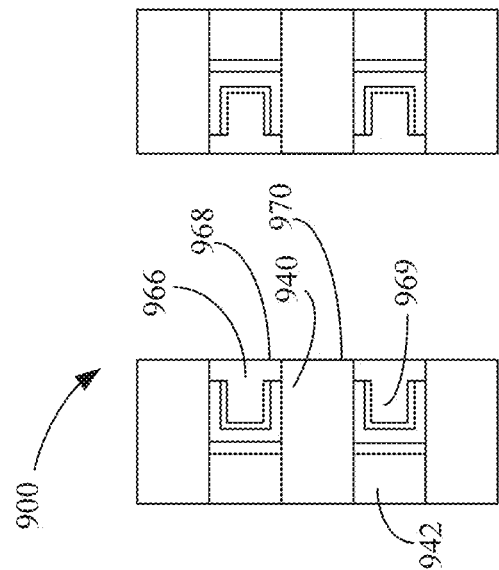

FIG. 9C is a cross-sectional view of the stack of materials 900 after isolating the second FG layer 966 by etching or oxidation until inner surface 968 of the second FG layer 966 is substantially even with the inner surface 970 of the tiered oxide layer 940. An etchant selective to oxide may be used to etch the second FG layer 966 even with the inner surface 970 of the tiered oxide layers 940. The second FG 966 includes a protrusion 969 extending towards a CG. FIG. 9D is a cross-sectional view of the stack of materials 900 after deposition of a channel material 980.

Thus, in FIG. 9D, a vertical string of memory cells 900 are shown having a memory cell that includes a control gate 942 between tiers of dielectric material 940 (oxide layers) a floating gate 966 between the tiers of dielectric material 940, wherein the floating gate 966 includes a protrusion 969 extending towards the control gate 942, and a charge blocking structure (layers 948, 950, 956) between the floating gate 966 and the control gate 942, wherein at least a portion of the charge blocking structure (layers 948, 950, 956) wraps around the protrusion 969.

The charge blocking structure includes a first layer of oxide 948, a layer of nitride 950 and a second layer of oxide 956, and the charge blocking structure (layers 948, 950, 956) includes a barrier structure (e.g., the second layer of oxide 956 or the nitride layer 950) that wraps around the protrusion 969. A layer of the nitride layer 950 and portions of the second layer of oxide 956 are disposed between the protrusion 969 and dielectric material 940. The floating gate 966 is in contact with the layer of nitride 950 and the second layer of oxide 956. Near the inner surface 970, floating gate portion 966 contacts a tier of the dielectric material 940. Only protrusion 969 of floating gate 966 extends toward the control gate 942. A length 971 of the floating gate 966 between the tiers of dielectric material 940 is substantially equal to a length 943 of the control gate 942 between the tiers of dielectric material 940.

A barrier film of the charge blocking structure, e.g., at least nitride layer 950, has a substantially vertical portion 959 disposed between the control gate 942 and the floating gate 966 and substantially horizontal portions 957 laterally extending partially between a tier of dielectric material 940 and a portion of floating gate 966. The barrier film may be the nitride layer 950. Protrusion 969 is separated from a tier of dielectric material 940 by at least a horizontal portion of the barrier film 950 and the second oxide layer 956.

The second layer of oxide 956 includes first and second substantially horizontal portions 987 and a substantially vertical portion 989, wherein a thickness of the substantially vertical portion 989 of the second layer of oxide 956 and the thickness of the horizontal portions 987 of the second layer of oxide 956 are substantially the same. A first portion of the floating gate 966 is separated from the first tier of dielectric material 940 by a substantially horizontal portion 957 of the barrier film 950 and the horizontal portion 987 of the second oxide layer 987. A thickness 999 of the substantially vertical portion 959 of the barrier film 950 is greater than a thickness 997 of the substantially horizontal portions 957 of the barrier film 950.

FIGS. 10A-F illustrate fabrication of a vertical memory as shown in FIG. 6C according to some embodiments. FIG. 10A is a cross-sectional view of a stacked cell 1000 showing alternating layers of tiered oxide 1040 and polysilicon tiered control gate (CG) layers 1042 to form a pillar 1011. The CG layer 1042 is etched to a predetermined depth to create a first recess area 1043 between the tiered oxide layers 1040.

FIG. 10B is a cross-sectional view of the stack of materials 1000 after a charge blocking structure is formed. In FIG. 10B, the charge blocking structure includes a first oxide layer 1048 formed substantially vertical over the recessed CG layer 1042 and a second layer 1050 (e.g., a nitride layer), which in some embodiments comprises a barrier film) formed over the length of the full pillar 1011. However, in FIG. 10B, the second layer 1050 has angled edges that narrow as proceeding toward the CG layer 1042. The second layer 1050 may be formed adjacent to the first oxide layer 1048 and adjacent to exposed surfaces of the oxide layers 1040 in the openings. The second layer 1050 (e.g., a nitride layer) forms recesses 1046

FIG. 10C is a cross-sectional view of the stack of materials 1000 after etching the inner surface 1052 of the second layer 1050 (e.g., nitride layer) beyond the inner surface 1070 of the tiered oxide layer 1040. An etchant selective to oxide may be used to etch the nitride layer.

FIG. 10D is a cross-sectional view of the stack of materials 1000 after forming a second oxidation layer 1056 over the second layer 1050 to complete the ONO layer. FIG. 10D also shows deposition of polysilicon over the length of the full pillar 1011 over the second oxidation layer 1056 and the tiered oxide layers 1040 for the FG layer 1060. The polysilicon for the FG layer 1060 may optionally be doped.

FIG. 10E is a cross-sectional view of the stack of materials 1000 after isolating the second FG layer 1060 by etching or oxidation until inner surface 1062 of the FG layer 1060 is substantially even with the inner surface 1070 of the tiered oxide layer 1040. An etchant selective to oxide may be used to etch the FG layer 1060 even with the inner surface 1070 of the tiered oxide layers 1040. The FG 1060 includes a protrusion 1069 extending towards a CG 1042.

FIG. 10D is a cross-sectional view of the stack of materials 1000 after forming a TuOx layer 1090 over FG layer 1060. The TuOx layer 1090 may be grown over the FG layer 1060.

As a result of implementing the apparatus and methods described herein, greater density and more reliable memory operation may be achieved. Increased customer satisfaction may result.

Thus, in FIG. 10F, a vertical string of memory cells 1000 are shown having a memory cell that includes a control gate 1042 between tiers of dielectric material 1040 (oxide layers) a floating gate 1060 between the tiers of dielectric material 1040, wherein the floating gate 1060 includes a protrusion 1069 extending towards the control gate 1042, and a charge blocking structure (layers 1048, 1050, 1056) between the floating gate 1060 and the control gate 1042, wherein at least a portion of the charge blocking structure, e.g., nitride layer 1050 and/or second oxide layer 1056, at least partially wraps around the protrusion 1069.

The charge blocking structure includes a first layer of oxide 1048, a layer of nitride 1050 and a second layer of oxide 1056, and the charge blocking structure (layers 1048, 1050, 1056) includes a barrier structure (e.g., the second layer of oxide 1056 and/or the nitride layer 1050) that at least partially wraps around the protrusion 1069. Portions of the layer of the nitride layer 1050 and portions of the second layer of oxide 1056 are disposed between the protrusion 1069 and a dielectric material 1040. The second layer of oxide 1056 completely separates the layer of nitride 1050 from the floating gate 1060. The floating gate 1060 is in contact with the second oxide layer 1056 and is not in contact with the nitride layer 1050.

Only protrusion 1069 of floating gate 1060 extends toward the control gate 1042. A barrier film of the charge blocking structure, e.g., at least one of layers 1050, 1056, has a substantially vertical portion 1059 disposed between the control gate 1042 and the floating gate 1060 and substantially horizontal portions 1057 laterally extending at least partially between a tier of dielectric material 1040 and a portion of floating gate 1060. The barrier film may be the nitride layer 1050.

Protrusion 1069 is separated from a tier of dielectric material 1040 by at least a horizontal portion of the barrier film 1050 and/or the second oxide layer 1056. The second layer of oxide 1056 include substantially horizontal portions 1087 and a substantially vertical portion 1089, wherein a thickness of the substantially vertical portion 1089 of the second layer of oxide 1056 and the thickness of the horizontal portions 1087 of the second layer of oxide 1056 are substantially the same. A first portion of the floating gate 1060 is separated from the first tier of dielectric material 1040 by the substantially horizontal portions 1087 of the second oxide layer 1056. Another portion of the floating gate 1060 is separated from the first tier of dielectric material 1040 by the substantially horizontal portions 1057 of the barrier film 1050 and horizontal portions 1087 of the second layer of oxide 1056.

Such embodiments of the inventive subject matter may be referred to herein, individually and/or collectively, without intending to voluntarily limit the scope of this application to any single concept if more than one is in fact disclosed. Thus, although specific embodiments have been illustrated and described herein, any arrangement calculated to achieve the same purpose may be substituted for the specific embodiments shown. This disclosure is intended to cover any and/or all adaptations or variations of various embodiments. Combinations of the above embodiments, and other embodiments not specifically described herein, will be apparent to those of skill in the art upon reviewing the above description.

The term "horizontal" as used in this application is defined as a plane parallel to the plane or surface of a wafer or substrate, regardless of the actual orientation of the wafer or substrate. The term "vertical" refers to a direction perpendicular to the horizontal as defined above. Prepositions, such as "on", "side", "higher", "lower", "over" and "under" are defined with respect to the plane or surface being on the top surface of the wafer or substrate, regardless of the actual orientation of the wafer or substrate. The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the embodiments is defined only by the appended claims, along with the full scope of equivalents to which such claims are entitled.

A NAND array architecture is an array of memory cells arranged such that the memory cells of the array are coupled in logical rows to access lines (which are coupled to, and in some cases are at least partially formed by, the CGs of the memory cells), which are referred to as word lines. Some memory cells of the array are coupled together in series, source to drain, between a source line and the data line, which is referred to as a bit line.

Memory cells in NAND array architecture can be programmed to a predetermined data state. For example, electric charge can be accumulated (e.g., placed) on, or removed from, an FG of a memory cell to program the cell into one of a number of data states. For example, a memory cell referred to as a single level cell (SLC) can be programmed to a one of two data states, e.g., a "1" or a "0" state. Memory cells referred to as multilevel cells (MLCs) can be programmed to a one of more than two data states.

When electrons are stored on the FG, they modify the $V_t$ of the cell. Thus, when the cell is "read" by placing a specific voltage on the CG (e.g., by driving the access line coupled to the cell with a read voltage), electrical current will either flow or not flow between the cell's source and drain connections, depending on the Vt of the cell. This presence or absence of current can be sensed and translated into 1's and 0's, reproducing the stored data.

Each memory cell may not directly couple to a source line and a data line. Instead, the memory cells of an example array may be arranged together in strings, typically of 8, 16, 32, or more strings each, where the memory cells in the string are coupled together in series, source to drain, between a common source line and a common data line.

A NAND architecture can be accessed by a row decoder activating a row of memory cells by driving the access line coupled to those cells with a voltage. In addition, the access lines coupled to the unselected memory cells of each string can be driven with a different voltage. For example, the unselected memory cells of each string can be driven with a pass voltage so as to operate them as pass transistors, allowing them to pass current in a manner that is unrestricted by their programmed data states. Current can then flow from the source line to the data line through each floating gate memory cell of the series coupled string, restricted by the memory cell of each string that is selected to be read. This places the currently encoded, stored data values of the row of selected memory cells on the column bit lines. A column page of data lines is selected and sensed, and then individual data words are selected from the sensed data words from the column page and communicated from the memory apparatus. The flash memory, such as a NAND array, may be formed as a 3D memory with a stack of memory cells that includes floating gates (FGs), charge blocking structures (e.g., IPD), control gates (CGs), and tiers of dielectric material, (e.g., oxide layers 108). In the illustrated example, IPD 104 is disposed between each FG 102 and CG 106. A recess is formed adjacent to a CG for the IPD and a FG.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, subject matter of the embodiments lies in one or more features of a single disclosed embodiment. Thus the following claims are hereby incorporated into the Detailed Description, with each claim standing on its own as a separate embodiment.

What is claimed is:

1. An apparatus including a vertical string of memory cells, wherein a memory cell of the vertical string of memory cells comprises:
 a control gate between a first tier of dielectric material and a second tier of dielectric material;
 a floating gate between the first tier of dielectric material and the second tier of dielectric material, wherein the floating gate contacts the first tier of dielectric material and the second tier of dielectric material; and
 a charge blocking structure between the floating gate and the control gate, wherein the charge blocking structure comprises a barrier film, wherein a substantially vertical portion of the barrier film is between the control gate and the floating gate, wherein a first substantially horizontal portion of the barrier film laterally extends partially between the first tier of dielectric material and the floating gate, and wherein a second substantially horizontal portion of the barrier film laterally extends partially between the second tier of dielectric material and the floating gate.

2. The apparatus of claim 1, wherein a first portion of the floating gate is separated from an upper surface of the first tier of dielectric material by the first substantially horizontal portion of the barrier film, and further wherein a second portion of the floating gate is separated from a lower surface of the second tier of dielectric material by the second substantially horizontal portion of the barrier film.

3. The apparatus of claim 1, wherein a thickness of the substantially vertical portion of the barrier film is greater than a thickness of the first substantially horizontal portion of the barrier film and is greater than a thickness of the second substantially horizontal portion of the barrier film.

4. The apparatus of claim 1, wherein a length of the floating gate between the tiers of dielectric material is substantially equal to a length of the control gate between the tiers of dielectric material.

5. The apparatus of claim 1, wherein the barrier film comprises a layer of nitride.

6. The apparatus of claim 1, wherein the charge blocking structure further comprises first and second layers of oxide.

7. The apparatus of claim 6, wherein the barrier film comprises a layer of nitride.

8. The apparatus of claim 6, wherein a first portion of the floating gate is separated from an upper surface of the first tier of dielectric material by the first substantially horizontal portion of the barrier film and a first portion of the second layer of oxide, and further wherein a second portion of the floating gate is separated from a lower surface of the second tier of dielectric material by the second substantially horizontal portion of the barrier film and a second portion of the second layer of oxide.

9. The apparatus of claim 8, wherein a third portion of the floating gate is separated from the upper surface of the first tier of dielectric material by a third portion of the second layer of oxide, and further wherein a fourth portion of the floating gate is separated from the lower surface of the second tier of dielectric material by a fourth portion of the second layer of oxide.

10. The apparatus of claim 6, wherein the floating gate includes a protrusion extending towards the control gate.

11. The apparatus of claim 10, wherein the protrusion is separated from an upper surface of the first tier of dielectric material by at least the first substantially horizontal portion of the barrier film and a first portion of the second layer of oxide, and further wherein the protrusion is separated from a lower surface of the second tier of dielectric material by at least the second substantially horizontal portion of the barrier film and a second portion of the second layer of oxide.

12. The apparatus of claim 11, wherein the first and second portions of the second layer of oxide comprise first and second substantially horizontal portions of the second layer of oxide, wherein the second layer of oxide further comprises a substantially vertical portion, and wherein a thickness of the substantially vertical portion of the second layer of oxide, a thickness of the first substantially horizontal portion of the second layer of oxide, and a thickness of the second substantially horizontal portion of the second layer of oxide are substantially the same.

13. The apparatus of claim 10, wherein the charge blocking structure further comprises a first layer of oxide contacting the control gate and a second layer of oxide contacting the floating gate, and wherein the barrier film is positioned between the first layer of oxide and the second layer of oxide.

14. The apparatus of claim 13, wherein the barrier film comprises a layer of nitride.

15. The apparatus of claim 13, wherein at least a portion of the charge blocking structure wraps around the protrusion.

16. The apparatus of claim 13, wherein the second layer of oxide wraps around the protrusion of the floating gate.

17. The apparatus of claim 14, wherein the floating gate is in contact with the layer of nitride and the second layer of oxide.

18. The apparatus of claim 14, wherein the second layer of oxide completely separates the layer of nitride from the protrusion of the floating gate.

19. The apparatus of claim 14, wherein the protrusion of the floating gate is in contact with the second layer of oxide and is not in contact with the layer of nitride.

* * * * *